United States Patent [19]

Hoshino

[11] Patent Number: 4,910,169
[45] Date of Patent: Mar. 20, 1990

[54] METHOD OF PRODUCING SEMICONDUCTOR DEVICE

[75] Inventor: Kazuhiro Hoshino, Tokyo, Japan

[73] Assignee: Fujitsu Limited, Kawasaki, Japan

[21] Appl. No.: 97,739

[22] Filed: Sep. 17, 1987

[30] Foreign Application Priority Data

Sep. 17, 1986 [JP] Japan .................................. 61-218319

[51] Int. Cl.$^4$ ............................................ H01L 21/44
[52] U.S. Cl. .................................... 437/198; 437/189; 437/195; 437/230; 437/235; 437/241; 357/67; 427/39
[58] Field of Search ............... 437/198, 230, 195, 235, 437/189, 241; 357/67; 427/38, 39

[56] References Cited

U.S. PATENT DOCUMENTS

| | | | |
|---|---|---|---|
| 3,725,309 | 4/1973 | Ames et al. | 252/512 |
| 4,393,096 | 7/1983 | Gajda | 437/198 |
| 4,423,547 | 1/1984 | Farrar et al. | 437/195 |
| 4,502,207 | 3/1985 | Ohshima et al. | 437/198 |
| 4,519,872 | 5/1985 | Anderson, Jr. et al. | 437/235 |
| 4,525,383 | 6/1985 | Saito | 437/195 |
| 4,557,037 | 12/1985 | Hanoka et al. | 437/230 |
| 4,609,565 | 9/1986 | Yates | 437/230 |
| 4,612,698 | 9/1986 | Gonsiorawski et al. | 437/188 |

FOREIGN PATENT DOCUMENTS

0083020 7/1983 European Pat. Off. .

OTHER PUBLICATIONS

Wolf et al., Silicon Processing for VLSI ERA, vol. 1: Process Technology, Lattice Press, Sunset Beach, pp. 368-371.
Ameen et al., "Protection of Ml-Cu Surface Prior to M2 Evaporation", IBM Technical Disclosure Bulletin, vol. 24, No. 6, Nov. 1981, p. 2989.
Schnable et al., "Failure Mechanisms in Large-Scale Integrated Circuits", IEEE Transactions on Electron Devices, vol. ED-16, No. 4, Apr. 1969, pp. 322-332.
Papageorgopoulos, "Studies of Separate Adsorption and Coadsorption of CS and $O_2$ on Cu (100)", Physical Review B, vol. 25, No. 6, pp. 3740-3749.
Learn, "Suppression of Aluminum Hillock Growth by Overlayers of Silicon Dioxide Chemically-Vapor-Deposited at Low Temperature", J. Vac. Sci. Technology B 4(3), May/Jun. 1986, pp. 774-776.
Wolf et al., Silicon Processing for the VLSI ERA, vol. 1: Process Technology, Sunset Beach, Lattice Press, 1986, pp. 348-353.
IBM Technical Disclosure Bulletin, vol. 25, No. 3B, Aug. 1982, pp. 1677-1680, New York, U.S.; C. Y. Ting: "Using Al2O3 for VLSI Multilevel Interconnections".
Extended Abstracts, Spring Meeting, Toronto, CA., 11th-16th May 1975, vol. 75-1, pp. 258-260, abstract No. 112, Electrochemical Soc., Philadelphia, U.S.; J. M. Morabito et al.: "Material Characterization of Ti-Cu-Ni-Au (TCNA): a new low cost thin-film conductor system".
Japanese Journal of Applied Physics Supplements 17th Conference on Solid State Devices and Materials, Aug. 25th-27th, 1985, pp. 329-332, Tokyo, JP; K. Machida et al.: "New planarization technology using Bias-ECR plasma deposition".
29th Electronic Components Conference, Cherry Hill, N.J., May 14th-16th, 1979, pp. 162-169, IEEE, New York, U.S.; R. J. Nika et al.: "Oxidation kinetics of Cu thin films in air at 100 degrees centigrade to 300 degrees centigrade".
Patent Abstracts of Japan, vol. 5, No. 149 (E-75) [821], Sep. 19th, 1981; JP-A-56 81 952 (Hitachi Seisakusho K. K.) 04-07-1981.
European Search Report, The Hague, 10-12-87.

Primary Examiner—Brian E. Hearn
Assistant Examiner—Andrew Griffis
Attorney, Agent, or Firm—Staas & Halsey

[57] ABSTRACT

A method of producing a semiconductor device includes the steps of forming a metallization film including copper on a surface of a substrate, and depositing an insulating film on a surface of the metallization film at a temperature which is below the oxidation temperature of copper.

15 Claims, 2 Drawing Sheets

METHOD OF PRODUCING SEMICONDUCTOR DEVICE

CROSS-REFERENCE TO RELATED APPLICATION

The subject matter of this application is related to copending application Nos. 097,738 filed Sept. 17, 1987 and 097,741 filed Sept. 17, 1987.

BACKGROUND OF THE INVENTION

The present invention generally relates to methods of producing semiconductor devices, and in particular to methods of producing semiconductor devices using copper or copper alloys as a wiring or metallization material.

It is known, that a metallization pattern of a large scale integrated circuit (LSI) diminishes in width as its integration density increases. Although aluminum (Al) metallization is widely used for semiconductor chips, its width for metallization is limited to the range of 0.5 to 0.6 $\mu$m. This is because electromigration increases as the aluminum metallization pattern becomes narrower. For these reasons, the use of a metallic material of a high melting point such as molybdenum (Mo) or tungsten (W) in place of Al has been considered. However, the resistivity of Mo and W is approximately twice the resistivity of Al in bulk and is even greater in a thin film. Therefore, need exists for a metallization material having a high electromigration resistance and a low resistivity.

Presently, copper (Cu) is being investigated for metallization of LSIs due to its better electromigration resistance and lower resistivity than Al. A conventional semiconductor device with copper metallization is designed so that a copper metallization film is directly deposited on an insulating film such as silicon dioxide ($SiO_2$) which is deposited on a silicon (Si) substrate and over contact holes formed in the insulating film so as to be positioned on diffused layers formed in the Si substrate. The copper film then patterned in accordance with a wiring pattern.

The semiconductor device thus configured is generally annealed at a high temperature on the order of 400° C. or greater in order to grow grains of Cu and thereby improve the electromigration resistance. Thereafter, an insulating film is deposited on the Cu metallization film as well as the insulating film. The deposition of the insulating film is conventionally carried out by a chemical vapor deposition (CVD) at a temperature of approximately 420° C. The insulating film on the copper metallization film may be made of, for example, phosphosilicate glass (PSG), silicon nitride ($Si_3N_4$) or $SiO_2$. The insulating film acts as a passivation film or a layer-to-layer insulating film in multilevel interconnections.

However, there are disadvantages with the conventional method of producing semiconductor devices with the Cu metallization method mentioned above. That is, the oxidation temperature of Cu ranges from 200° to 250° C., whereas the heat treating temperature in the CVD is on the order of 400° C. or greater. Therefore, Cu in the metallization film is easily oxidized due to oxygen which exists in an ambient atmosphere when depositing the insulating film by the CVD process. Oxidation of Cu damages the surface of the metallization film which is in contact with the insulation film and therefore degrades the Cu metallization film especially in terms of resistance.

SUMMARY OF THE INVENTION

Accordingly, a general object of the present invention is to provide a novel and effective method of producing a semiconductor device, in which the above problems have been eliminated.

A more specific object of the present invention is to provide a method of producing a semiconductor device, in which oxidation of a metallization film including at least copper is effectively prevented and its metallization resistance is kept low even after deposition of an insulating layer.

To attain the above-mentioned objects and features, according to the present invention, there is provided a method of producing a semiconductor device comprising the steps of forming a metallization film including copper on a surface of a substrate, and depositing an insulating film on the surface including the metallization film at a temperature which is lower than an oxidation temperature of copper.

Other objects and further features of the present invention will be apparent from the following detailed description when read in conjunction with the attached drawings.

DETAILED DESCRIPTION OF THE PREFERRED EMBODIMENTS

Figure 1A:
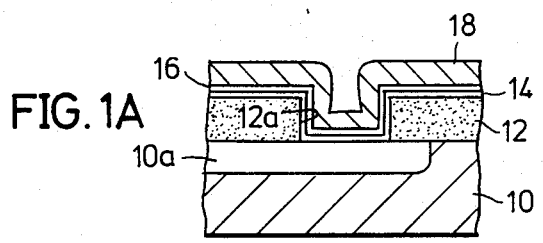
FIGS. 1A through 1D are elevational cross sectional views illustrating a method of producing a semiconductor device according to a preferred embodiment of the present invention.
Figure 1B:
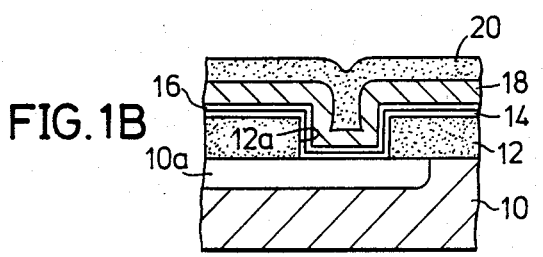
Figure 1C:
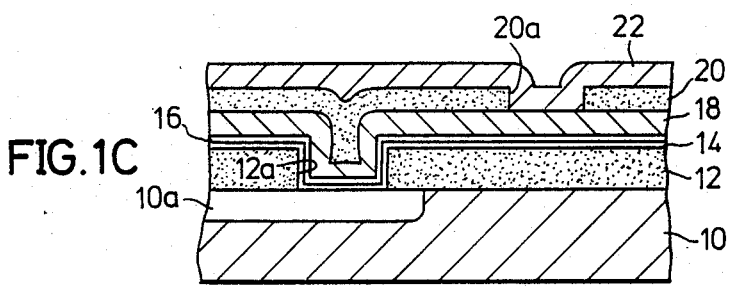
Figure 1D:
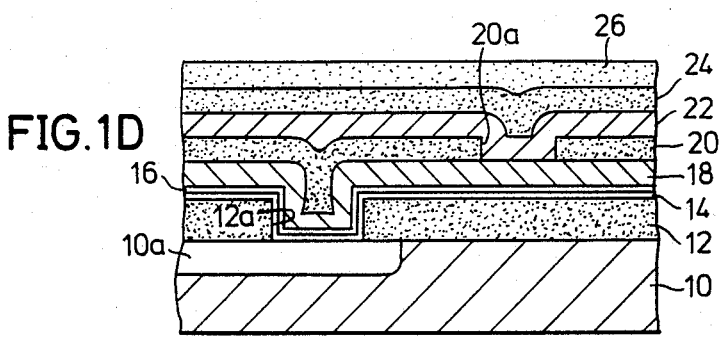

A description is now given of a preferred embodiment of a method of producing a semiconductor device according to the present invention by referring to FIGS. 1A through 1D. As will become apparent from a description provided hereafter, FIGS. 1A and 1B show producing steps with respect to a first-level Cu metallization film, FIGS. 1C and 1D show producing steps with regard to a second-level Cu metallization film.

Referring to FIG. 1A, an insulating film 12 is deposited on the top surface of a silicon substrate 10, in which there is formed an $n^+$-diffused layer 10a. The insulating film 12 may be silicon dioxide ($SiO_2$), phosphosilicate glass (PSG) or silicon nitride ($Si_3N_4$). The width of the insulating film 12 is 4,000 Å, for example. Then, a metallic layer 14 is deposited on the top of the $n^+$-diffused layer 10a. The metallic layer 14 may be made of Ti, Al or platinum (Pt). The deposition of the metallic layer 14 may be carried out by a D.C. magnetron sputtering method. When using Ti, for example, a Ti target is sputtered in argon (Ar) gas at a pressure of 5 mTorr with a power of D.C. 2 kW. The film thickness of the metallic layer 14 is preferably in the range of 100 Å to 1,000 Å. The metallic layer 14 is provided to form an ohmic contact to the Si substrate 10. This is because using Ti, for example, titanium silicide ($TiSi_2$), which is produced by the application of heat, makes a low-resistance contact.

Next, a barrier layer 16 is deposited on the metallic layer 14. The barrier layer 16 has the same pattern as a Cu metallization layer 18, which will be described in detail later. In other words, the barrier layer 16 underlies the Cu metallization layer 18. The barrier layer 16 prevents the reaction and interdiffusion between the Cu metallization film 18 and the Si substrate 10 and also between the former and the insulating film 12. In effect, the barrier layer 16 prevents not only the Cu atoms from diffusing into the Si substrate 10 and the insulating fim 12 but also the Si atoms from migrating to the Cu metallization film 18. The barrier layer 16 may be made of titanium nitride (TiN), tungsten (W), tungsten nitride (WN), zirconium nitride (ZrN), titanium carbide (TiC), tungsten carbide (WC), tantalum (Ta), tantalum nitride (TaN) or titanium tungsten (TiW). The film thickness of the barrier layer 16 is preferably in the range of 500 Å to 3,000 Å. The barrier layer 16 may be deposited by means of a reactive magnetron sputtering method. For example, a target of Ti is sputtered in Ar+$N_2$ gas at a pressure of 5 mTorr with a power of D.C. 4 kW.

Thereafter, the Cu metallization film 18 is deposited on the barrier layer 16. The Cu metallization film 18 may be deposited by means of the D.C. magnetron sputtering method. For example, a target of Cu is sputtered in Ar gas at a pressure of 5 mTorr with a power of D.C. 2 kW. The film thickness of Cu is preferably in the range of 3,000 Å to 2 $\mu$m. It is also possible to use in place of Cu, alloy of Cu an such as Cu-Ti or Cu-Zr as a material for forming the metallization film 18 which is to be deposited on the diffusion barrier layer 16.

The metallic layer 14, the barrier layer 16 and the Cu metallization film 18 are patterned in accordance with a wiring pattern. Patterning these layers may be performed by the following steps. First, a mask layer of PSG or TiN, for example, is deposited on the top of the Cu metallization film 18 by the reactive magnetron sputtering method. Secondly, a resist is patterned on the top of the mask layer. Then, the mask is etched off by a reactive ion etching process. Thereafter, the resist ashing is carried out. Next, the Cu metallization film 18 is etched off and thus patterned by an ion milling process. Finally, the underlying metallic layer 14 and the barrier layer 16 are etched off together with the mask by the reactive ion etching process.

The structure thus produced is illustrated in FIG. 1A.

The next step is illustrated in FIG. 1B. A layer-to-layer insulating film 20 is deposited over the top surface of the structure shown in FIG. 1A including the Cu metallization layer 18. In this deposition, it is important to grow the layer-to-layer insulating film 20 at a temperature lower than 200° C. This process may be carried out by radio frequency (RF) sputtering, plasma-assisted chemical vapor deposition (PCVD) or electron cyclotron resonance (ECR) PCVD. When using the RF sputtering or PCVD, $SiO_2$, PSG or $Si_3N_4$ may be employed as a material of the layer-to-layer insulating layer 20, whereas when using the ECR-PCVD, $SiO_2$ or $Si_3N_4$ may be used. Tables I, II and III illustrate examples of each deposition method mentioned above.

TABLE I

| | (RF-SPUTTERING) | |
|---|---|---|
| Material | Gas; Temp. | Power; Pressure |
| $SiO_2$ | Ar; 100–180° C. | Rf 2 kW; 1.7 × $10^{-3}$ Torr |
| PSG | Ar; 100–180° C. | Rf 2 kW; 1.7 × $10^{-3}$ Torr |
| $Si_3N_4$ | Ar; 100–180° C. | Rf 2 kW; 1.7 × $10^{-3}$ Torr |

TABLE II

| | (PCVD) | |
|---|---|---|
| Material | Gas; Temp. | Power; Frequency; Pressure |
| $SiO_2$ | $SiH_4$ (6 cc) + $N_2O$ (300 cc) + $N_2$ (54 cc); 200° C. Growth | Rf 35 W; 200 kHz; 1 Torr |
| PSG | 1% $PH_3$ (50 cc) + $N_2$ (50 cc) 200° C. Growth | Rf 35 W; 200 kHz; 1 Torr |
| $Si_3N_4$ | $SiH_4$ (25 cc) + $NH_3$ (100 cc) + $N_2$ (200 cc); 200° C. Growth | Rf 35 W; 200 kHz; 1 Torr |

TABLE III

| | (ECR-PCVD) | |
|---|---|---|
| Material | Gas & Temp. | Power; Frequency; Pressure |
| $SiO_2$ | $SiH_4$ (20 cc) + $O_2$ (40 cc); 150° C. Growth | Rf 1 kW; 2.45 GHz; 1 m Torr |
| $Si_3N_4$ | $SiH_4$ (10 cc) + $N_2$ (30 cc); 150° C. Growth | Rf 400–500 W; 2.45 GHz; 1 m Torr |

It becomes apparent from the above tables that the temperature during the deposition process is kept lower than 200° C. which is a limit where Cu is oxidized. It is therefore possible to prevent an increase in the resistance of the Cu metallization film 18 if temperature is kept less than or equal to 200° C.

When configuring a multilevel interconnection, a through hole 20a is formed in the layer-to-layer insulating film 20, as seen in FIG. 1c. Then, Cu is metallized over the layer-to-layer insulating film 20, so that a Cu metallization film 22 is formed. This deposition may be carried out by the D.C. magnetron sputtering method. The thickness of the Cu metallization film 22 is preferably in the range of 3,000 Å to 2 $\mu$m. Thereafter, the Cu metallization film 22 is patterned by the reactive ion etching. As seen FIG. 1D an insulating film 24 is then deposited on Cu metallization film 22 by means of one of the methods described in relation to the deposition of the insulating film 20. Finally, an insulating cover film 26 is deposited on the insulating film 22. In this deposition, even the CVD may be employed, because the second-level Cu metallization film 22 is totally covered by the insulating film 24. The combination of materials of the insulating films 20, 24 and 26 is arbitrary. For example, it is possible to form any of the insulating films 20, 24 and 26 with any of $SiO_2$, PSG, and $Si_3N_4$.

Figure 2:
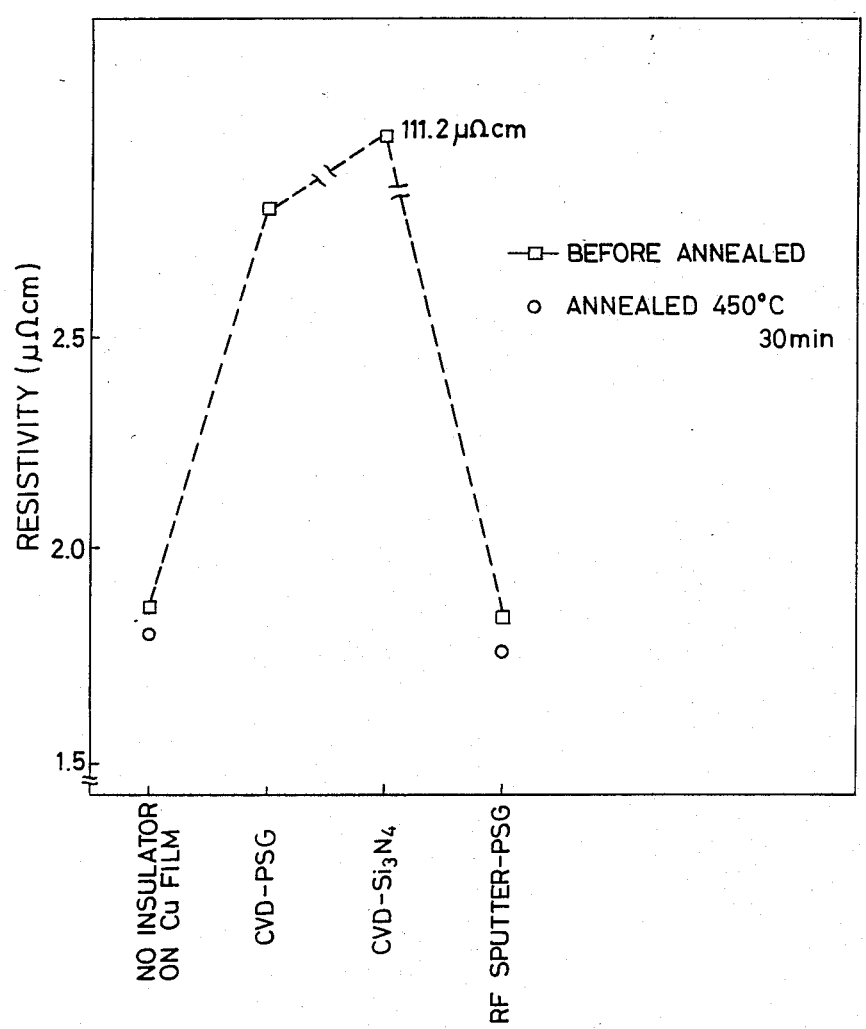
FIG. 2 is a graph illustrating the advantages provided by the method of the present invention.

FIG. 2 shows the experimental results of the measurement of the resistivity ($\mu\Omega$m) of four types of semiconductor devices. A first type of a semiconductor device has a structure without an insulating film on the Cu metallization film 18 as shown in FIG. 1A. A second type has a structure in which a CVD-PSG insulating film 20 is deposited on the Cu metallization film 18, as shown in FIG. 1B. A third type has a structure in which a CVD-$Si_3N_4$ insulation film 20 is deposited on the Cu metallization film 18. A fourth type has a structure in which a RF sputter-PSG insulating film 20 is deposited on the Cu metallization film 18. The resistivity was plotted for each sample before annealing and after annealing at 450° C. for 30 minutes. The experimental results clearly show that the RF sputtering which is one of the deposition methods for the insulating film 20 is extremely effective to prevent an increase in the resistivity of the Cu metallization film 18 even when 450° C. annealing is carried out. In contrast a, conventional CVD method causes an increase of the resistivity even before the annealing. Therefore, a further increase in the resistivity due to the annealing is likely to result using conventional methods. For this reason, it was not necessary to take a resistivity measurement of the CVD-PSG and CVD-$Si_3N_4$.

The present invention is not limited to the preferred embodiments, and variations and modifications may be made without departing from the scope of the present invention.

What is claimed is:

1. A method of producing a semiconductor device comprising the steps of:
   forming a copper metallization film on a surface of a substrate;
   patterning said copper metallization film so as to obtain a patterned metallization film having a pre-determined pattern; and
   depositing an insulating film over said surface of the substrate and on said patterned metallization film at a temperature which is lower than an oxidation temperature of copper.

2. A method of producing a semiconductor device as claimed in claim 1, wherein the temperature at said depositing step is 200° C. or lower.

3. A method of producing a semiconductor device as claimed in claim 1, further comprising the steps of:
   annealing said semiconductor device after depositing the insulating film.

4. A method of producing a semiconductor device comprising the steps of:
   forming a copper metallization film on a surface of a substrate;
   patterning said copper metallization film so as to obtain a patterned metallization film having a pre-determined pattern; and
   depositing an insulating film over said surface of the substrate and on said patterned metallization film by a radio frequency sputtering process at a temperature less than the oxidation temperature of copper.

5. A method of producing a semiconductor device as claimed in claim 4, wherein said radio frequency sputtering process is carried out at a temperature which is less than or equal to 200° C.

6. A method of producing a semiconductor device as claimed in claim 4, wherein said insulating film is made of a material selected from the group consisting of silicon dioxide, phosphor-silicate glass and silicon nitride.

7. A method of producing a semiconductor device as claimed in claim 4, wherein said method further comprises the step of annealing said semiconductor device after depositing the insulating film.

8. A method of producing a semiconductor device comprising the steps of:
   forming a copper metallization film on a surface of a substrate;
   patterning said copper metallization film so as to obtain a patterned metallization film having a pre-determined pattern; and
   depositing an insulating film over said surface of the substrate and on said patterned metallization film by an electron cyclotron resonance plasma-assisted chemical vapor deposition process at a temperature less than the oxidation temperature of copper.

9. A method of producing a semiconductor device as claimed in claim 8, wherein said electron cyclotron resonance plasma-assisted chemical vapor deposition process is carried out at a temperature which is less than or equal to 200° C.

10. A method of producing a semiconductor device as claimed in claim 8, wherein said insulating film is made of a material selected from the group consisting of silicon nitride and silicon dioxide.

11. A method of producing a semiconductor device as claimed in claim 8, further comprising the step of annealing said semiconductor device after depositing the insulating film.

12. A method of producing a semiconductor device comprising the steps of:
   forming a copper metallization film on a surface of a substrate;
   patterning said copper metallization film so as to obtain a patterned metallization film having a pre-determined pattern; and
   depositing an insulating film over said surface of the substrate and on said patterned metallization film by a plasma-assisted chemical vapor deposition process at a temperature less than the oxidation temperature of copper.

13. A method of producing a semiconductor device as claimed in claim 12, wherein said plasma-assisted chemical vapor deposition process is carried out at a temperature which is less than or equal to 200° C.

14. A method of producing a semiconductor device as claimed in claim 12, wherein said insulating film is made of a material selected from the group consisting of silicon oxide, phosphor-silicate glass and silicon nitride.

15. A method of producing a semiconductor device as claimed in claim 12, further comprising the step of annealing said semiconductor device after depositing the insulating film.

* * * * *